(12) United States Patent
Jo et al.

(10) Patent No.: US 9,170,679 B2
(45) Date of Patent: Oct. 27, 2015

(54) CAPACITANCE SENSING APPARATUS AND METHOD, AND TOUCH SCREEN APPARATUS

(75) Inventors: Byeong Hak Jo, Gyunggi-do (KR); Tah Joon Park, Gyunggi-do (KR); Kyung Hee Hong, Gyunggi-do (KR); Moon Suk Jeong, Gyunggi-do (KR); Yong Il Kwon, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 505 days.

(21) Appl. No.: 13/613,500

(22) Filed: Sep. 13, 2012

(65) Prior Publication Data
US 2014/0009216 A1    Jan. 9, 2014

(30) Foreign Application Priority Data
Jul. 9, 2012 (KR) .................. 10-2012-0074551

(51) Int. Cl.
*G06F 3/044* (2006.01)
*G06F 3/041* (2006.01)
*H03K 17/96* (2006.01)

(52) U.S. Cl.
CPC .............. *G06F 3/0418* (2013.01); *G06F 3/044* (2013.01); *H03K 17/962* (2013.01); *H03K 2217/960725* (2013.01)

(58) Field of Classification Search
CPC ...... G06F 3/0418; G06F 3/044; H03K 17/926
See application file for complete search history.

(56) References Cited

U.S. PATENT DOCUMENTS

| | | | |
|---|---|---|---|
| 2007/0030255 A1* | 2/2007 | Pak et al. | 345/173 |
| 2011/0163768 A1 | 7/2011 | Kwon et al. | |
| 2011/0193817 A1* | 8/2011 | Byun et al. | 345/174 |
| 2013/0257785 A1* | 10/2013 | Brown et al. | 345/174 |

FOREIGN PATENT DOCUMENTS

KR    10-2011-0137482    12/2011

* cited by examiner

*Primary Examiner* — Temesgh Ghebretinsae
*Assistant Examiner* — Lisa Landis
(74) *Attorney, Agent, or Firm* — NSIP Law

(57) ABSTRACT

There is provided a capacitance sensing apparatus including: a driving circuit unit applying a driving signal to a first capacitor; a first integrating circuit unit including a second capacitor charged by a change in capacitance generated in the first capacitor based on the driving signal to generate a first output voltage; and a second integrating circuit unit including a third capacitor charged by a change in capacitance generated in the second capacitor to generate a second output voltage, wherein a level of the second output voltage is changed at least twice during a single period of the driving signal applied to the first capacitor.

16 Claims, 4 Drawing Sheets

CAPACITANCE SENSING APPARATUS AND METHOD, AND TOUCH SCREEN APPARATUS

CROSS-REFERENCE TO RELATED APPLICATIONS

This application claims the priority of Korean Patent Application No. 10-2012-0074551 filed on Jul. 9, 2012, in the Korean Intellectual Property Office, the disclosure of which is incorporated herein by reference.

BACKGROUND OF THE INVENTION

1. Field of the Invention

The present invention relates to a capacitance sensing apparatus and a method thereof, and a touch screen apparatus.

2. Description of the Related Art

A touch sensing apparatus such as a touch screen, a touch pad, or the like, an input apparatus integrated with a display apparatus to provide an intuitive input method to a user, has recently been widely used in various electronic apparatuses such as a portable phone, a personal digital assistant (PDA), a navigation device, or the like. Particularly, as demand for smart phones has grown in recent times, the use of a touch screen as a touch sensing apparatus capable of providing various input methods in a limited form factor has correspondingly increased.

Touch screens used in portable apparatuses may be largely classified as resistive-type touch screens and capacitive-type touch screens according to a method of sensing a touch input utilized therein. Here, capacitive-type touch screens have advantages in that they have a relatively long lifespan and various input methods and gestures may be used therewith, such that the use thereof has increased. Particularly, a multi-touch interface may more easily be implemented in capacitive-type touch screens as compared to resistive-type touch screens, such that a multi-touch interface is widely used in smart phones, and the like.

Capacitive-type touch screens include a plurality of electrodes having a predetermined pattern defining a plurality of nodes in which a change in capacitance is generated by a touch input. In the plurality of nodes distributed on a two-dimensional plane, a change in self-capacitance or a change in mutual-capacitance is generated by the touch input. Coordinates of the touch input may be calculated by applying a weighted average method, or the like, to the change in capacitance generated in the plurality of nodes. In order to accurately calculate the coordinates of the touch input, a technology capable of accurately sensing the change in capacitance generated by the touch input is required. However, in the case in which electrical noise is generated in a wireless communications module, a display apparatus, or the like, it may hinder the change in capacitance from being accurately sensed.

RELATED ART DOCUMENT (Patent Document 1) US Patent Publication No. 2011/0163768
(Patent Document 2) Korean Patent Laid-Open Publication No. 2011-137482

SUMMARY OF THE INVENTION

An aspect of the present invention provides a method of significantly reducing an influence of noise on a target change in capacitance to be measured.

Another aspect of the present invention provides a capacitance sensing apparatus and method, and a touch screen apparatus capable of removing common noise by performing integration of a driving signal twice in positive and negative directions thereof, during a single period thereof, using first and second integrating circuit units.

According to an aspect of the present invention, there is provided a capacitance sensing apparatus including: a driving circuit unit applying a driving signal to a first capacitor; a first integrating circuit unit including a second capacitor charged by a change in capacitance generated in the first capacitor based on the driving signal to generate a first output voltage; and a second integrating circuit unit including a third capacitor charged by a change in capacitance generated in the second capacitor to generate a second output voltage, wherein a level of the second output voltage is changed at least twice during a single period of the driving signal applied to the first capacitor.

The level of the second output voltage may be increased when a level of the first output voltage is decreased.

A level of the first output voltage may be regularly and repeatedly decreased, held, increased, held, increased, held, decreased, and held.

The first integrating circuit unit may include a first switch connected to a ground terminal and a second switch connected to an input node of the first integrating circuit unit, the first and second switches may be turned on and turned off at a predetermined interval, and the interval at which the first and second switches are turned on and turned off may be equal to half of period for which the driving signal is applied to the first capacitor.

The second integrating circuit unit may include a third switch connected to a ground terminal and a fourth switch connected to an input node of the second integrating circuit unit, the third and fourth switches may be turned on and turned off at a predetermined interval, and the interval at which the third and fourth switches are turned on and turned off may be equal to a period for which the driving signal is applied to the first capacitor.

The third and fourth switches may be turned on and turned off so as to have a phase difference from the period for which the driving signal is applied to the first capacitor by a period equal to a time for which the first or second switch is turned on.

The first integrating circuit unit may further include a fifth switch resetting the second capacitor, the fifth switch being operated in the same manner as that of the first switch.

According to another aspect of the present invention, there is provided a capacitance sensing method including: applying a driving signal to a first capacitor; charging a second capacitor with charges from the first capacitor to generate a first output voltage; and charging a third capacitor with charges from the second capacitor to generate a second output voltage, wherein changes in a level of the second output voltage are detected multiple times during a single period in which the first capacitor is charged and discharged.

In the generating of the first output voltage, a first switch connected to a ground terminal and a second switch connected to an input node of a first integrating circuit unit generating the first output voltage may be turned on and turned off twice during the single period in which the first capacitor is charged and discharged.

In the generating of the second output voltage, a third switch connected to a ground terminal and a fourth switch connected to an input node of a second integrating circuit unit generating the second output voltage may be turned on and turned off once during the single period in which the first capacitor is charged and discharged.

In the generating of the second output voltage, the third and fourth switches may be turned on and turned off so as to have a phase difference from a period for which the driving signal is applied to the first capacitor by a period equal to a time for which the first or second switch is turned on.

According to another aspect of the present invention, there is provided a touch screen apparatus including: a panel unit including a plurality of driving electrodes and a plurality of sensing electrodes; a driving circuit unit applying a driving signal to each of the plurality of driving electrodes; a sensing circuit unit sensing changes in capacitance generated in intersections between the driving electrodes to which the driving signal is applied and the plurality of sensing electrodes; and a controlling unit controlling operations of the driving circuit unit and the sensing circuit unit, wherein the sensing circuit unit includes first and second integrating circuit units, and a level of an output signal from the second integrating circuit unit is changed multiple times during a single period of the driving signal.

The second integrating circuit unit may generate the output signal transferred to the controlling unit based on charges charged in a capacitor included in the first integrating circuit unit.

The controlling unit may determine a touch input applied to the panel unit based on the output signal from the second integrating circuit unit.

The level of the output signal from the second integrating circuit unit may be increased when a level of an output signal from the first integrating circuit unit is decreased.

A level of an output signal from the first integrating circuit unit may be regularly and repeatedly decreased, held, increased, held, increased, held, decreased, and held.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
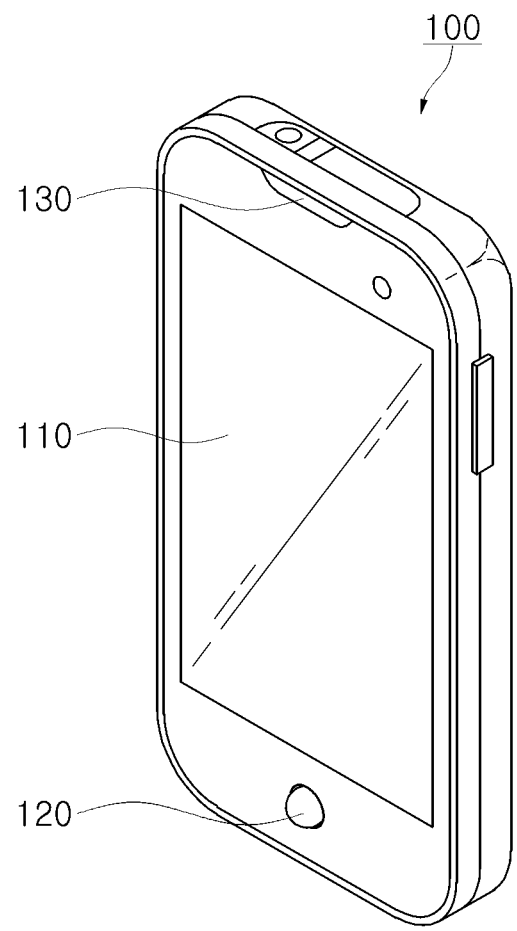
FIG. 1 is a perspective view showing an exterior of an electronic apparatus including a touch screen apparatus according to an embodiment of the present invention.

Embodiments of the present invention will hereinafter be described in detail with reference to the accompanying drawings. These embodiments will be described in detail in order to allow those skilled in the art to practice the present invention. It should be appreciated that various embodiments of the present invention are different but are not necessarily exclusive. For example, specific shapes, configurations, and characteristics described in an embodiment of the present invention may be implemented in another embodiment without departing from the spirit and scope of the present invention. In addition, it should be understood that positions and arrangements of individual components in each embodiment may be changed without departing from the spirit and scope of the present invention. Therefore, a detailed description provided below should not be construed as being restrictive. In addition, the scope of the present invention is defined only by the accompanying claims and their equivalents if appropriate. Similar reference numerals will be used to describe the same or similar functions throughout the accompanying drawings.

Hereinafter, embodiments of the present invention will be described in detail with reference to the accompanying drawings so that those skilled in the art may easily practice the present invention.

FIG. 1 is a perspective view showing an exterior of an electronic apparatus including a touch screen apparatus according to an embodiment of the present invention. Referring to FIG. 1, an electronic apparatus 100 according to the embodiment of the present invention may include a display apparatus 110 for outputting an image, an input unit 120, an audio unit 130 for outputting audio, and a touch screen apparatus integrated with the display apparatus 110.

As shown in FIG. 1, in the case of a mobile apparatus, the touch screen apparatus may be generally provided in a state in which it is integrated with the display apparatus and needs to have light transmissivity high enough to allow the image displayed by the display apparatus to be transmitted therethrough. Therefore, the touch screen apparatus may be implemented by forming sensing electrodes formed of a transparent, electrically conductive material such as indium-tin oxide (ITO), indium zinc oxide (IZO), zinc oxide (ZnO), carbon nano tube (CNT), or graphene on a base substrate formed of a transparent film material such as polyethylene terephthalate (PET), polycarbonate (PC), polyethersulfone (PES), polyimide (PI), or the like. A wiring pattern connected to the sensing electrodes formed of the transparent conductive material is disposed in a bezel region of the display apparatus 110, and is visually shielded by the bezel region, and thus the wiring pattern may be formed of a metal material such as silver (Ag), copper (Cu), or the like.

Since it is assumed that the touch screen apparatus according to the embodiment of the present invention is operated in a capacitive scheme, the touch screen apparatus may include a plurality of electrodes having a predetermined pattern. In addition, the touch screen apparatus according to the embodiment of the present invention may include a capacitance sensing apparatus for detecting a change in capacitance generated in the plurality of electrodes. Hereinafter, a capacitance sensing apparatus and a method of operation thereof according to an embodiment of the present invention will be described with reference to FIGS. 2 through 4.

Figure 2:
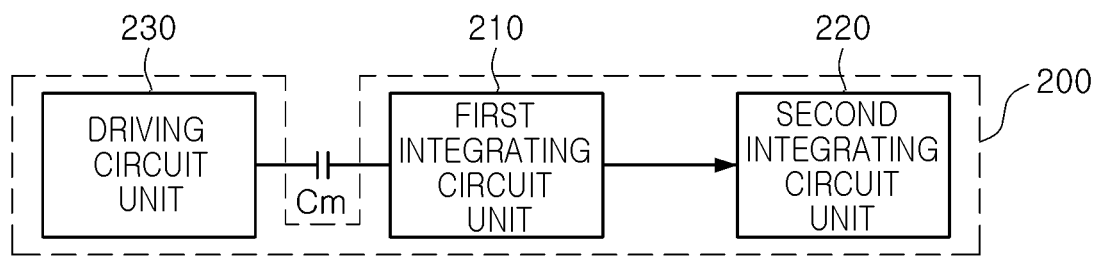
FIG. 2 is a block diagram showing a capacitance sensing apparatus according to an embodiment of the present invention.

FIG. 2 is a block diagram showing a capacitance sensing apparatus according to an embodiment of the present invention. Referring to FIG. 2, a capacitance sensing apparatus 200 according to the embodiment of the present invention may include a driving circuit unit 230, a first integrating circuit unit 210, and a second integrating circuit unit 220. A capacitor Cm in which a target change in capacitance to be measured is generated may be connected between the driving circuit unit 230 and the first integrating circuit unit 210.

In FIG. 2, the capacitor Cm may correspond to a capacitor in which the target capacitance to be measured by the capacitance sensing apparatus 200 according to the embodiment of the present invention is charged. As an example, the capacitance of the capacitor Cm may correspond to mutual capacitance generated between a plurality of electrodes included in a capacitive-type touch screen. Hereinafter, for convenience of explanation, it is assumed that the capacitance sensing apparatus 200 according to the embodiment of the present invention senses a change in capacitance generated in the capacitive-type touch screen. In this case, the capacitor Cm may be a node capacitor where charges are charged or discharged according to a change in mutual capacitance generated in intersections between the plurality of electrodes.

The driving circuit unit 230 may generate a predetermined driving signal for charging the capacitor Cm with the charges and supply the driving signal to the capacitor Cm. The driving signal may be a square wave signal having a pulse form and a predetermined frequency. The first integrating circuit unit 210 may include at least one capacitor charged or discharged by the capacitor Cm. The first integrating circuit unit 210 may generate an output voltage from an amount of charge charged in or discharged from the capacitor. That is, the output voltage of the first integrating circuit unit 210 may be determined according to the capacitance of the capacitor Cm, the capacitance of the capacitor included in the first integrating circuit unit 210, a voltage level of the driving signal, and the like.

The second integrating circuit unit 220 may include at least one capacitor charged or discharged by the capacitor included in the first integrating circuit unit 210. The second integrating circuit unit 220 may generate an output voltage from an amount of charge charged in or discharged from the capacitor. The first and second integrating circuit units 210 and 220 may include a plurality of switches. Operations of the plurality of switches may be controlled to control operations of the first and second integrating circuit units 210 and 220.

Figure 3:
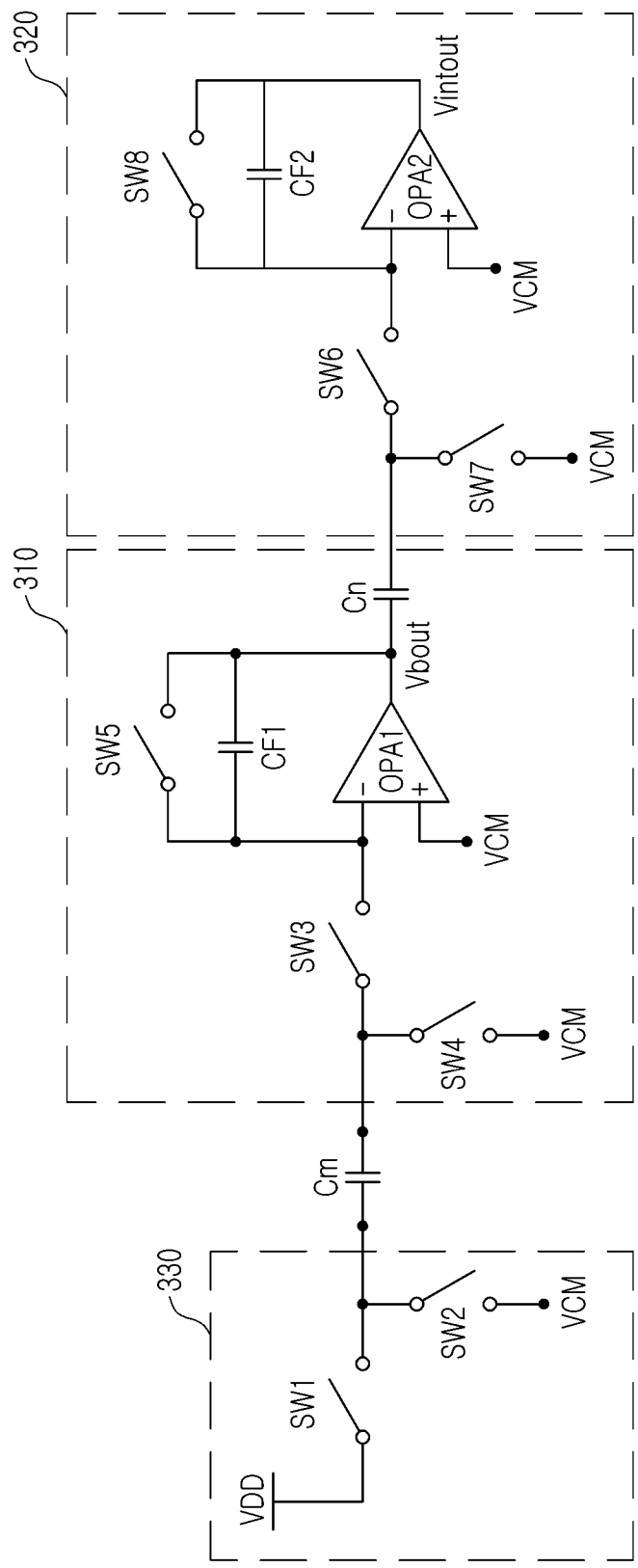
FIG. 3 is a circuit diagram showing a capacitance sensing apparatus according to an embodiment of the present invention.

FIG. 3 is a circuit diagram showing a capacitance sensing apparatus according to an embodiment of the present invention.

Referring to FIG. 3, a capacitance sensing apparatus according to an embodiment of the present invention may include a driving circuit unit 330, a first integrating circuit unit 310, and a second integrating circuit unit 320. Hereinafter, a detailed operation of the capacitance sensing apparatus according to the embodiment of the present invention will be described with reference to the circuit diagram shown in FIG. 3. Similar to FIG. 2, a capacitor Cm may correspond to a node capacitor of a capacitive-type touch screen.

First, the driving circuit unit 330 may include two switches SW1 and SW2. Here, the switch SW1 may be connected to a node supplying a voltage VDD and a first node of a capacitor Cm. Meanwhile, the switch SW2 may be connected to a node supplying a common voltage VCM and the first node of the capacitor Cm. In the case in which the switch SW1 is turned on (closed), charges may be charged in the capacitor Cm by the voltage VDD, and in the case in which the switch SW2 is turned on, the charges charged in the capacitor Cm may be discharged. As a result, the switches SW1 and SW2 may be operated at different turn-on intervals.

Meanwhile, the first integrating circuit unit 310 may be connected to a second node of the capacitor Cm. The first integrating circuit unit 310 may include an operational amplifier OPA1, a capacitor CF1, a capacitor Cn, a switch SW3, a switch SW4, a switch SW5, and the like. The switch SW3 may be operated at a speed twice as fast as that of the switch SW1, and the switch SW4 may be operated at a speed twice as fast as that of the switch SW2. That is, during a time in which the switches SW1 and SW2 are turned on and turned off, the switches SW3 and SW4 may respectively be turned on and turned off twice. In addition, the switches SW3 and SW4 may be operated at different turn-on intervals.

The charges may be supplied to the capacitor CF1 of the first integrating circuit unit 310 through the capacitor Cm by the turn-on/off operations of the switches SW1 and SW3. During a time for which the switch SW5 connected in parallel with the capacitor CF1 of the first integrating circuit unit 310 is turned off, the charges charged in the capacitor Cm may be transferred to the capacitor CF1, and during a time for which the switch SW 5 is turned on, the operational amplifier OPA1 may be reset. Here, an output voltage Vbout of the operational amplifier OPA1 generated due to the charges charged in the capacitor CF1 may be determined via the following Equation 1.

$$Vbout = \frac{VDD * Cm}{CF1} \qquad \text{Equation 1}$$

As seen from Equation 1, the output voltage Vbout of the first integrating circuit unit 310 may be determined according to a capacitance ratio between the capacitor Cm and the capacitor CF1. Therefore, the capacitor CF1 may be configured to have capacitance significantly larger than that of the capacitor Cm including target charges to be measured, thereby preventing the output voltage Vbout of the first integrating circuit unit 310 from being saturated.

Meanwhile, the second integrating circuit unit 320 may be connected to a second node of the capacitor Cn included in the first integrating circuit unit 310. The second integrating circuit unit 320 may include an operational amplifier OPA2, a capacitor CF2, a switch SW6, a switch SW7, a switch SW8, and the like. The switch SW6 may be operated during the same operating period as that of the switch SW1 of the driving circuit unit 330, and the switch SW7 may be operated during the same operating period as that of the switch SW2 of the driving circuit unit 330. Meanwhile, the switch SW6 may have the same operating period as that of the switch SW1, but may be operated more rapidly than the switch SW1 by a period equal to a time for which the switch SW3 of the first integrating circuit unit 310 is turned on or turned off. The switch SW7 may also have the same operating period as that of the switch SW2, but may be operated more rapidly than the switch SW2 by a period equal to a time for which the switch SW4 of the first integrating circuit unit 310 is turned on or turned off. That is, operation signals of the switches SW6 and SW7 may have the same period as that of operation signals of the switches SW3 and SW4, but have a phase different from that of the operation signals of the switches SW3 and SW4. In addition, the switches SW6 and SW7 may be operated at different turn-on intervals.

During a time for which the switch SW6 is turned on and the switches SW7 and SW8 are turned off, the charges charged in the capacitor Cn of the first integrating circuit unit 310 may be transferred to the capacitor CF2, and during a time for which the switch SW8 is turned on, the operational amplifier OPA2 may be reset.

Figure 4:
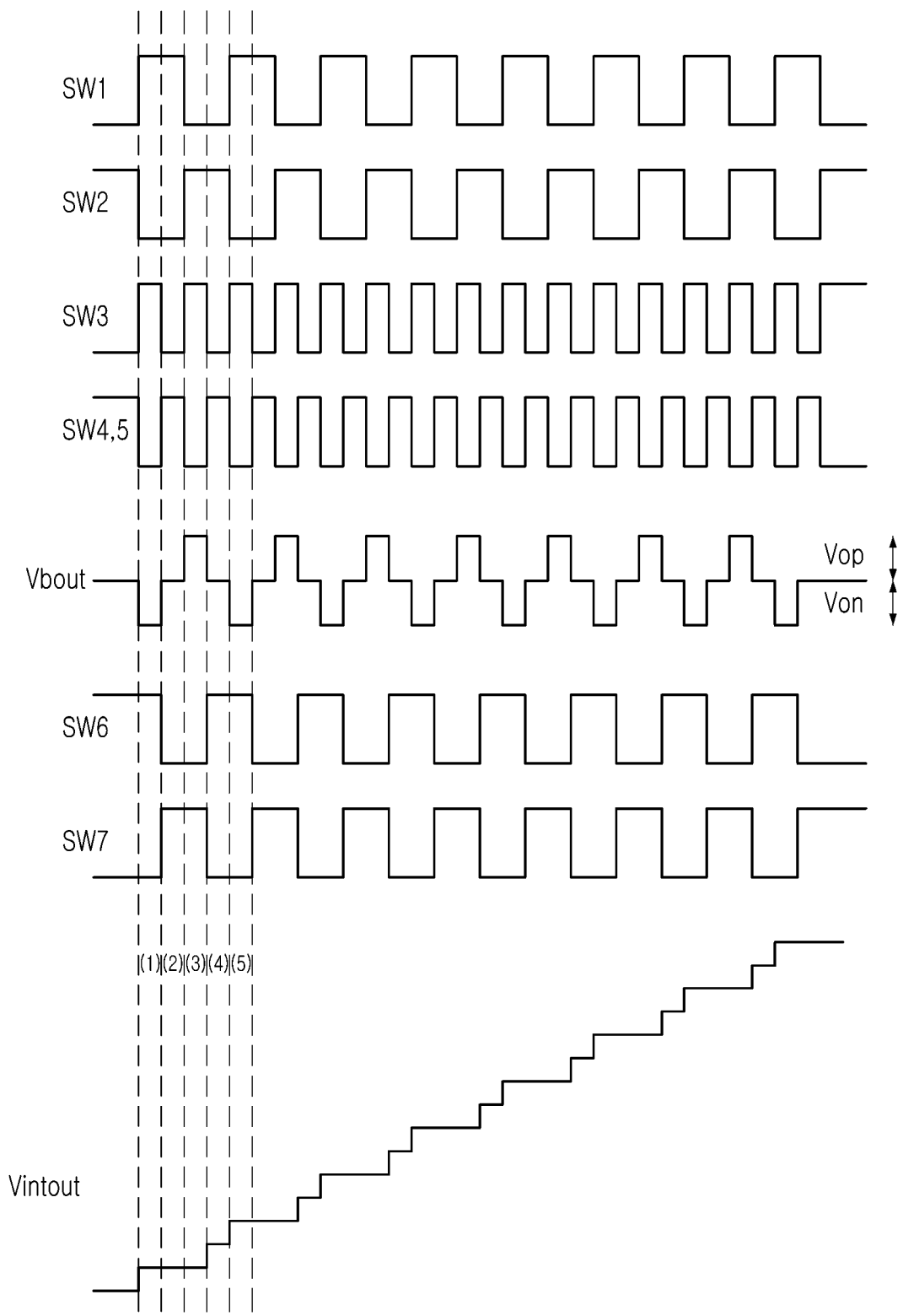
FIG. 4 is a view illustrating an operation of a capacitance sensing apparatus according to an embodiment of the present invention.

FIG. 4 is a view illustrating the capacitance sensing apparatus operated according to turn-on and turn-off states of the switches SW1 to SW7. In the case in which a signal of the switch has a high level, it indicates that the switch is turned on, and in the case in which the signal of the switch has a low level, it indicates that the switch is turned off. In FIG. 4, Vbout indicates an output voltage of the operational amplifier OPA1 of the first integrating circuit unit, and Vintout indicates an output voltage of the operational amplifier OPA2 of the second integrating circuit unit.

In section (1), the switches SW1 and SW3 are turned on and the switches SW2 and SW4 are turned off, such that charges charged in the capacitor Cm of the first integrating circuit unit by (VDD-VCM) are non-inverted and integrated and then output. In section (1), the output voltage Vbout1 output from the operational amplifier OPA1 of the first integrating circuit unit is determined via the following Equation 2.

$$Vbout1 = VCM - Cm/CF1 * (VDD - VCM - Vnoise1) \qquad \text{Equation 2}$$

Here, a value of a common voltage VCM is VDD/2, and Vnoise1 indicates a magnitude of introduced noise in section (1). In this case, charges are charged in the capacitor Cn of the first integrating circuit unit by (Vbout1−VCM) and the switch SW6 is turned, such that the charges charged in the capacitor Cn are integrated and output through the second integrating circuit unit. In section (1), an output voltage difference ΔVintout1 of the second integrating circuit unit is represented by the following Equation 3.

$$\Delta Vintout1 = \frac{Cn}{CF2} * (VCM - Vnoise1) \qquad \text{Equation 3}$$

That is, in section (1), at the time of an operation of the switch, the output voltage Vintout of the second integrating circuit unit is increased by ΔVintout1.

In section (2), the switches SW1, SW4, and SW5 are turned on and the switches SW2 and SW3 are turned off. Since the switch SW5 is turned on, the operational amplifier OPA1 of the first integrating circuit unit is reset, and the operational amplifier OPA1 outputs the common voltage VCM. In section (2), the switch SW6 of the second integrating circuit unit is turned off and the switch SW7 of the second integrating circuit unit is turned on, such that the output voltage Vintout of the second integrating circuit unit is held.

In section (3), the switches SW1 and SW4 are turned off and the switches SW2 and SW3 are turned on, such that the charges that have been charged in the capacitor Cm by (VDD-VCM) are discharged and an output voltage Vbout2 output from the operational amplifier OPA1 of the first integrating circuit unit is represented by the following Equation 4.

$$Vbout2 = VCM - \frac{Cm}{CF1} * (VCM - Vnoise2) \qquad \text{Equation 4}$$

In Equation 2, Vnoise2 indicates introduced noise in section (3).

In section (3), the switch SW6 is turned off and the switch SW7 is turned on, such that the output voltage Vintout of the second integrating circuit unit is held.

In section (4), the switches SW1 and SW3 are turned off and the switches SW2, SW4, and SW5 are turned on. Since the switch SW5 is turned on, the operational amplifier OPA1 of the first integrating circuit unit is reset, and the operational amplifier OPA1 outputs the common voltage VCM. In this case, the switch SW6 is turned on and the switch SW7 is turned off, such that the charges that have been charged in the capacitor Cn of the first integrating circuit unit by (Vbout2-VCM) are discharged and an output voltage difference ΔVintout2 of the second integrating circuit unit is represented by Equation 5.

$$\Delta Vintout2 = \frac{Cn}{CF2} * (Vbout2 - VCM) \qquad \text{Equation 5}$$

That is, in section (4), an output voltage Vintout of the second integrating circuit unit is increased by ΔVintout2.

During a single period in which the switches SW1 and SW2 are operated once, the entire output voltage difference ΔVintout of the second integrating circuit unit is represented by Equation 6.

$$\begin{aligned}\Delta Vintout &= \Delta Vintout1 - \Delta Vintout2 \qquad \text{Equation 6}\\ &= \frac{Cm}{CF1}\frac{Cn}{CF2}(VDD - VCM - Vnoise1) + \\ &\quad \frac{Cm}{CF1}\frac{Cn}{CF2}(VCM + Vnoise2)\\ &= \frac{Cm}{CF1}\frac{Cn}{CF2} * VDD * (Vnoise1 - Vnoise2)\end{aligned}$$

As seen in Equation 6, it may be confirmed that common noise is removed in a final output of the second integrating circuit unit.

That is, during a single period in which the driving signal is applied to the capacitor Cm by the switches SW1 and SW2, an effect of performing integration twice in positive and negative directions is generated, whereby the common noise may be efficiently removed.

Figure 5:
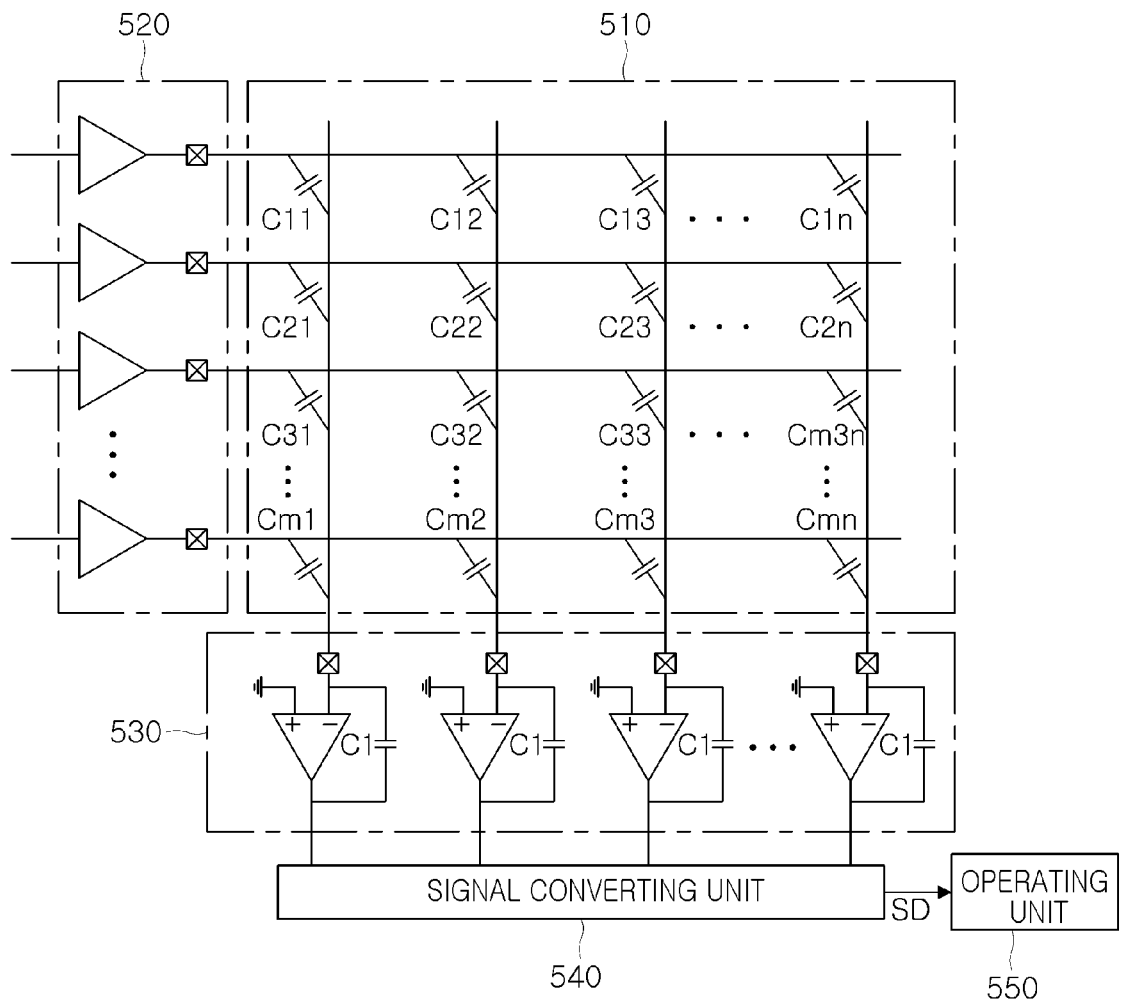
FIG. 5 is a view showing a touch screen apparatus including a capacitance sensing apparatus according to an embodiment of the present invention.

FIG. 5 is a view showing a touch screen apparatus including the capacitance sensing apparatus according to the embodiment of the present invention.

Referring to FIG. 5, the touch screen apparatus according to the present embodiment may include a panel unit 510, a driving circuit unit 520, a sensing circuit unit 530, a signal converting unit 540, and an operating unit 550. The panel unit 510 may include a plurality of first electrodes extended in a first axial direction, that is, a horizontal direction of FIG. 5 and a plurality of second electrodes extended in a second axial direction, that is, a vertical direction of FIG. 5, intersecting with the first axial direction. Here, changes in capacitance C11 to Cmn are generated in intersections between the first and second electrodes. The changes in capacitance C11 to Cmn generated in the intersections between the first and second electrodes may be changes in mutual capacitance generated by a driving signal applied to the first electrodes by the driving circuit unit 520. Meanwhile, the driving circuit unit 520, the sensing circuit unit 530, the signal converting unit 540, and the operating unit 550 may be implemented as a single integrated circuit (IC).

The driving circuit unit 520 may apply a predetermined driving signal to the first electrodes of the panel unit 510. The driving signal may be a square wave signal, a sine wave signal, a triangle wave signal, or the like, having a predetermined period and amplitude and be sequentially applied to each of the plurality of first electrodes. Although FIG. 5 shows that circuits for the generation and application of the driving signal are individually connected to the plurality of first electrodes, a single driving signal generating circuit may be provided to apply a driving signal to each of the plurality of first electrodes using switching circuits.

The sensing circuit unit 530 may include integrating circuits for sensing the changes in capacitance C11 to Cmn from the second electrodes. Each of the integrating circuits may include at least one operational amplifier and a capacitor C1 having a predetermined capacitance, wherein each of the operational amplifiers has an inverting input terminal connected to the second electrode to convert the changes in capacitance C11 to Cmn into an analog signal such as a voltage signal, or the like, and then output the analog signal. In the case in which the driving signal is sequentially applied to the plurality of first electrodes, since the changes in capacitance may be simultaneously detected from the plurality of second electrodes, the number of integrating circuits may correspond to the number (m) of second electrodes.

The signal converting unit 540 may generate a digital signal $S_D$ from an analog signal generated by the integrating circuit. For example, the signal converting unit 540 may include a time-to-digital converter (TDC) circuit measuring a time required for a voltage type analog signal outputted from the sensing circuit unit 530 to reach a predetermined reference voltage level and converting the measured time into a digital signal $S_D$ or an analog-to-digital converter (ADC) circuit measuring a variation in a level of an analog signal outputted from the sensing circuit unit 530 for a predetermined time and converting the measured variation into a digital signal $S_D$. The operating unit 550 may determine a touch input applied to the panel unit 510 using the digital signal $S_D$. As an example, the operating unit 550 may determine the number, coordinates, gesture operations, or the like, of touch inputs applied to the panel unit 510.

Comparing the capacitance sensing apparatus shown in FIGS. 2 and 3 and the touch screen apparatus shown in FIG. 5 with each other, the node capacitors C11 to Cmn generated in the intersections between the first and second electrodes may correspond to the capacitor Cm of FIGS. 2 and 3. In addition, the driving circuit unit 520 of FIG. 5 may correspond to the driving circuit units 230 and 330 of FIGS. 2 and 3, and the sensing circuit unit 530 of FIG. 5 may be a component including the first integrating circuit units 210 and 310 and the second integrating circuit units 220 and 320 of FIGS. 2 and 3.

As set forth above, according to embodiments of the present invention, integration may be performed twice in positive and negative directions during a single period of a driving signal through first and second integrating circuit units, whereby common noise may be efficiently removed.

While the present invention has been shown and described in connection with the embodiments, it will be apparent to those skilled in the art that modifications and variations can be made without departing from the spirit and scope of the invention as defined by the appended claims.

What is claimed is:

1. A capacitance sensing apparatus comprising:
    a driving circuit unit applying a driving signal to a first capacitor;
    a first integrating circuit unit including a second capacitor being charged by a change in capacitance generated in the first capacitor based on the driving signal, the first integrating circuit unit generating a first output voltage; and
    a second integrating circuit unit including a third capacitor charged by a change in capacitance generated in the second capacitor to generate a second output voltage,
    a level of the second output voltage being changed at least twice during a single period of the driving signal applied to the first capacitor, and
    the second capacitor being charged and discharged twice during a single period during which the first capacitor is charged and discharged once by the driving signal,
    wherein a level of the first output voltage is repeatedly: decreased, held, increased, held, increased, held, decreased, and held consecutively.

2. The capacitance sensing apparatus of claim 1, wherein the level of the second output voltage is increased when a level of the first output voltage is decreased.

3. The capacitance sensing apparatus of claim 1,
    wherein the first integrating circuit unit includes a first switch connected to a ground terminal and a second switch connected to an input node of the first integrating circuit unit,
    the first switch and the second switch are turned on and turned off at a predetermined interval, and
    the interval at which the first switch and the second switch are turned on and turned off is equal to half of a period for which the driving signal is applied to the first capacitor.

4. The capacitance sensing apparatus of claim 3, wherein the second integrating circuit unit includes a third switch connected to a ground terminal and a fourth switch connected to an input node of the second integrating circuit unit,
    the third and fourth switches are turned on and turned off at a predetermined interval, and
    the interval at which the third and fourth switches are turned on and turned off is equal to a period for which the driving signal is applied to the first capacitor.

5. The capacitance sensing apparatus of claim 4, wherein the third and fourth switches are turned on and turned off so as to have a phase difference from the period for which the driving signal is applied to the first capacitor by a period equal to a time for which the first or second switch is turned on.

6. The capacitance sensing apparatus of claim 3, wherein the first integrating circuit unit further includes a fifth switch resetting the second capacitor, the fifth switch being operated in the same manner as that of the first switch.

7. A capacitance sensing method comprising:
    applying a driving signal to a first capacitor;
    charging and discharging a second capacitor twice during a single period in which the first capacitor is charged and discharged to generate a first output voltage; and
    charging a third capacitor with charges from the second capacitor to generate a second output voltage,
    changes in a level of the second output voltage being detected multiple times during the single period in which the first capacitor is charged and discharged,
    wherein a level of the first output voltage is repeatedly: decreased, held, increased, held, increased, held, decreased, and held consecutively.

8. The capacitance sensing method of claim 7, wherein in the generating of the first output voltage, a first switch connected to a ground terminal and a second switch connected to an input node of a first integrating circuit unit generating the first output voltage are turned on and turned off twice during the single period in which the first capacitor is charged and discharged.

9. The capacitance sensing method of claim 8, wherein in the generating of the second output voltage, a third switch connected to a ground terminal and a fourth switch connected to an input node of a second integrating circuit unit generating the second output voltage are turned on and turned off once during the single period in which the first capacitor is charged and discharged.

10. The capacitance sensing method of claim 9, wherein in the generating of the second output voltage, the third switch and the fourth switch are turned on and turned off so as to have a phase difference from a period for which the driving signal is applied to the first capacitor by a period equal to a time for which the first or second switch is turned on.

11. A touch screen apparatus comprising:

a panel unit including a plurality of driving electrodes and a plurality of sensing electrodes;

a driving circuit unit applying a driving signal to each of the plurality of driving electrodes;

a sensing circuit unit sensing changes in capacitance generated in intersections between the driving electrodes to which the driving signal is applied and the plurality of sensing electrodes; and a controlling unit controlling operations of the driving circuit unit and the sensing circuit unit, the sensing circuit unit including a first integrating unit and a second integrating circuit unit, and a level of an output signal from the second integrating circuit unit being changed multiple times during a single period of the driving signal, and a capacitor included in the first integrating circuit unit being charged and discharged twice during a single period of the driving signal, wherein a level of an output signal from the first integrating circuit unit is repeatedly: decreased, held, increased, held, increased, held, decreased, and held consecutively.

12. The touch screen apparatus of claim 11, wherein the second integrating circuit unit generates the output signal transferred to the controlling unit based on charges charged in a capacitor included in the first integrating circuit unit.

13. The touch screen apparatus of claim 12, wherein the controlling unit determines a touch input applied to the panel unit based on the output signal from the second integrating circuit unit.

14. The touch screen apparatus of claim 11, wherein the level of the output signal from the second integrating circuit unit is increased when a level of an output signal from the first integrating circuit unit is decreased.

15. The capacitance sensing apparatus of claim 3, wherein the interval at which the first switch and the second switch are turned on and turned off, which is equal to half of the period for which the driving signal is applied to the first capacitor, causes the second capacitor to be charged and discharged twice during the single period during which the first capacitor is charged and discharged once by the driving circuit.

16. The capacitance sensing apparatus of claim 3, wherein the interval at which the first switch and second switch are turned on and off, which is equal to half of the period for which the driving signal is applied the first capacitor, causes one or more of the first integrating circuit unit and the second integrating circuit unit to perform integration twice in positive and negative directions during the period for which the driving signal is applied to the first capacitor.

\* \* \* \* \*